United States Patent
Fujii et al.

[11] Patent Number: 5,118,640
[45] Date of Patent: Jun. 2, 1992

[54] METHOD OF MANUFACTURING A SEMICONDUCTOR MEMORY

[75] Inventors: Taku Fujii, Nara; Narakazu Shimomura, Gojo, both of Japan

[73] Assignee: Sharp Kabushiki Kaisha, Japan

[21] Appl. No.: 725,326

[22] Filed: Jul. 8, 1991

Related U.S. Application Data

[63] Continuation-in-part of Ser. No. 633,301, Dec. 24, 1990, abandoned.

[30] Foreign Application Priority Data

Dec. 29, 1989 [JP] Japan ................ 1-340159
Mar. 23, 1990 [JP] Japan ................ 2-74639

[51] Int. Cl.⁵ .......................... H01L 21/70
[52] U.S. Cl. .......................... 437/52; 437/47; 437/60; 148/DIG. 14; 148/DIG. 109
[58] Field of Search .............. 437/47, 52, 60; 148/DIG. 14, DIG. 109

[56] References Cited

U.S. PATENT DOCUMENTS

| | | | |
|---|---|---|---|
| 3,984,822 | 10/1976 | Simko et al. | 437/52 |
| 3,986,903 | 10/1976 | Watrous, Jr. | 437/52 |
| 4,268,951 | 5/1981 | Elliott et al. | 437/44 |
| 4,327,476 | 5/1982 | Iwai et al. | 437/90 |
| 4,577,392 | 3/1986 | Peterson et al. | 437/203 |
| 4,774,206 | 9/1988 | Willer | 437/203 |
| 4,852,062 | 7/1989 | Baker et al. | 437/44 |
| 4,879,254 | 11/1989 | Tsuzuki et al. | 437/203 |
| 4,889,827 | 12/1989 | Willer | 437/203 |
| 4,916,083 | 4/1990 | Monkowski et al. | 437/203 |
| 4,951,175 | 8/1990 | Kurosawa et al. | 361/313 |
| 4,965,217 | 10/1990 | Desilets et al. | 437/203 |
| 4,977,105 | 12/1990 | Okamoto et al. | 437/203 |
| 5,025,741 | 6/1991 | Suwanai et al. | 437/52 |

FOREIGN PATENT DOCUMENTS

| | | | |
|---|---|---|---|
| 0317160 | 5/1989 | European Pat. Off. | |
| 4007582 | 9/1990 | Fed. Rep. of Germany | |
| 0037960 | 2/1987 | Japan | 437/52 |
| 0237551 | 10/1988 | Japan | 437/203 |
| 0078270 | 3/1990 | Japan | 437/52 |

OTHER PUBLICATIONS

Patents Abstracts of Japan, vol. 14 No. 292 (E-944)(4235), 25 Jun. 1990; & JP-A-2 094 554 (Toshiba Corp.) Apr. 5, 1990.
Patents Abstracts of Japan, vol. 11, No. 288 (E-542)(2735), 17 Sep. 1987; & JP-A-62 086 853 (Fijitsu Ltd.), Apr. 21, 1987.

Primary Examiner—Brian E. Hearn
Assistant Examiner—Trung Dang
Attorney, Agent, or Firm—Nixon & Vanderhye

[57] ABSTRACT

A method of manufacturing a semiconductor memory includes the steps of, on a semiconductor substrate having underlayer wiring which is composed of a plurality of gate portions provided with side walls and a diffused region between the gate regions, i) forming a layer insulating film which is smaller in thickness in the diffused region than the side walls of each of the gate regions and which is made of a material etched more easily than the material of the semiconductor substrate; ii) depositing a conductive layer of a material etched more easily than the layer insulating film, over the entire surface of the layer insulating film; iii) removing the conductive layer simply except a portion where a contact hole is to be formed in the diffused region, by etching with a pattern film for forming the contact hole; iv) depositing an insulating film and a pattern film for forming the contact hole over the entire surface again; and v) removing the insulating film, the remaining conductive layer and the layer insulating film by etching one after another to form the contact hole extending to the diffused region in self-alignment, and forming a toothed projection of the insulating film which remains after the etching at an upper opening of the contact hole by removing the pattern employed for forming the contact hole.

9 Claims, 16 Drawing Sheets

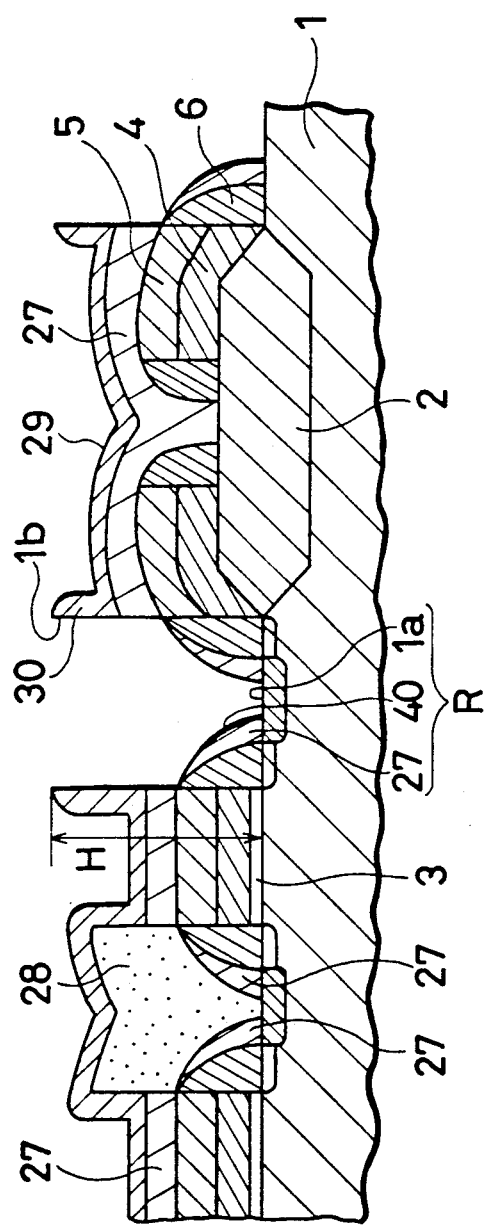
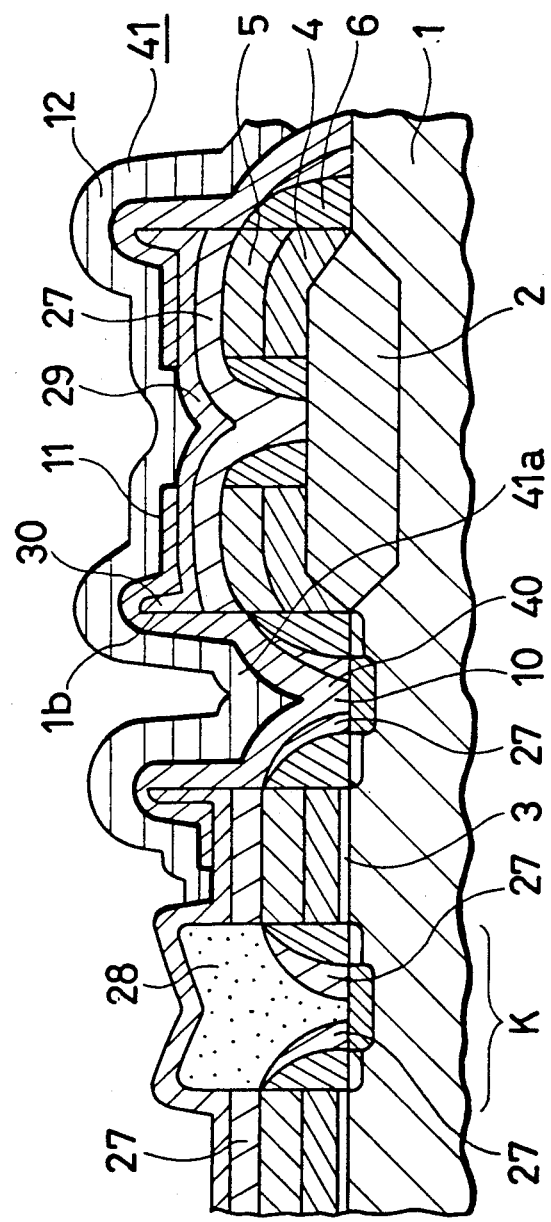
FIG.1(e)
FIG.1(f)

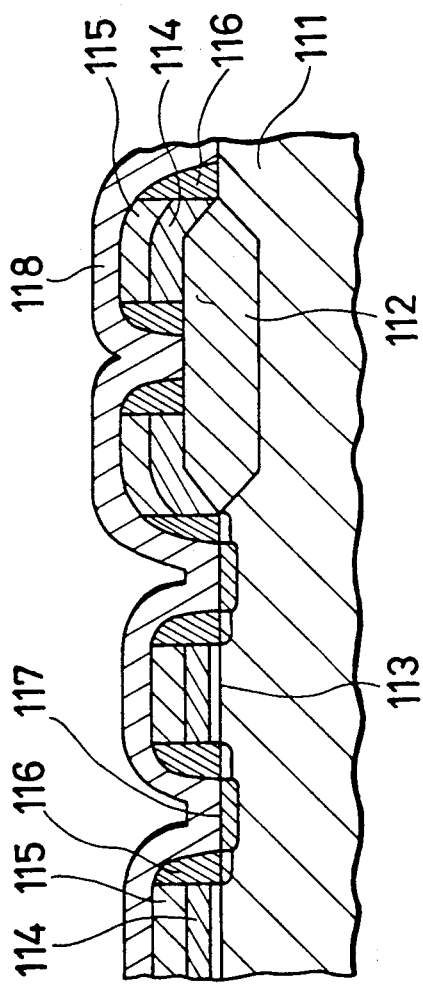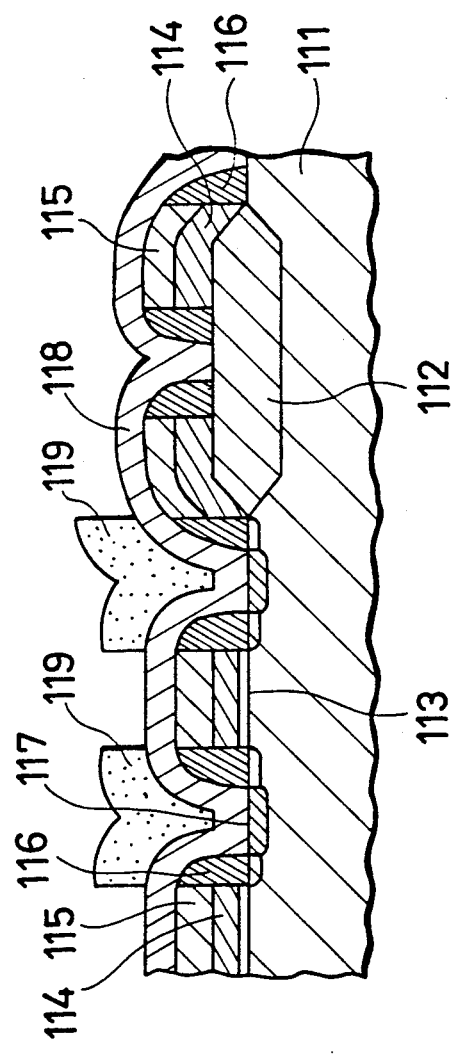
FIG.3(a)
FIG.3(b)

METHOD OF MANUFACTURING A SEMICONDUCTOR MEMORY

This is a continuation-in-part of application Ser. No. 07/633,301, filed Dec. 24, 1990 now abandoned.

BACKGROUND OF THE INVENTION

1. Field of the Invention

The present invention relates to a method of manufacturing a semiconductor memory, and more particularly, it relates to a method of manufacturing a semiconductor memory of wiring width 0.8 μm or under, with high yields.

2. Description of the Prior Art

A prior art embodiment and its disadvantages will be described with reference to diagrams for explaining structures of main parts of a semiconductor substrate.

In the prior art embodiment, as shown in FIGS. 5(a) and 5(b), after second underlayer wiring 73 is formed in a semiconductor substrate 71 which has first underlayer wiring (diffused layer) 72 formed by diffusing a layer insulating film 74 of SiO$_2$ or the like is deposited; and thereafter, a contact hole 74a is formed by etching or the like. Upper wiring 75 is formed over the contact hole 74a; and thus, the wirings are electrically connected between the upper and lower layers.

In particular, in the case where the overlayer wiring 75 is made of a metal material like Al while the first under layer wiring 72 is formed of the diffused layer formed in the substrate 71, it is likely that the metal wiring 75 and the substrate 71 are short-circuited in a part shown by an arrow Q in FIG. 6 when the contact hole 74a and the diffused layer, or the first underlayer wiring 72, are out of alignment. However, as shown in FIG. 7, such short-circuiting can be prevented if the surface of the substrate which is exposed because of the contact hole formed for the purpose of the connection with the first underlayer wiring 72 is covered with a polycrystalline Si film 76 doped with an impurity at high concentration so that the polycrystalline Si film 76 is interposed between the metal wiring 75 and the substrate 71. Specifically, the short-circuiting between the substrate 71 and the metal wiring 75 is prevented by covering the end of the diffused region exposed in the contact hole 74a with the polycrystalline Si film 76 which is doped with an impurity at high concentration. This is because an impurity with which the polycrystalline Si film 76 is doped at high concentration is diffused towards the substrate, so that no short-circuiting is caused even if the polycrystalline Si film 76 is deposited on the end of the diffused region.

Two problems arise in the above-mentioned way of covering the contact hole 74a with the polycrystalline Si film 76:

1) The distance between contact holes cannot be reduced.

For example, a case in which the polycrystalline Si film 76 covering the substrate 71 in the contact holes is etched will be discussed. When the polycrystalline Si film 76 is etched under the state where a part of the substrate is exposed because of the disregistration of the photoresist determining the configuration of the polycrystalline Si film 76 to be etched, the exposed portion is etched away as shown by an arrow R in FIG. 8 because the substrate is of silicon. The etching of the substrate may cause drawbacks such as a junction leak and the like. Hence, the end of the contact hole 74a in the polycrystalline Si film 76 must be positioned a distance d (0.1 μm to 0.3 μm) from the region where the substrate is exposed [see FIG. 11].

On the other hand, the lowermost limit of the distance between polycrystalline Si patterns is determined by the resolution of a light exposing projector. Thus, the minimum distance between the contact holes is about the double of the distance d (0.2 μm to 0.6 μm) added to the resolution (about 0.6 μm) of the exposing projector. In other words, approximating a distance L between the contact holes 74a, 74a [see FIG. 11] to the resolution (about 0.6 μm) of the exposing projector is impossible.

2) It is difficult to form the contact holes in self-alignment.

As shown in FIG. 9, the layer insulating film 74 is deposited on the second underlayer wiring 73, and then a portion where a contact hole is to be formed is etched down by the depth corresponding to the thickness of the layer insulating film 74 to form the contact hole on the surface of the substrate in self-alignment relative to the second underlayer wiring 73.

However, when a plurality of overlayer wiring layers 75 exist to connect with the substrate 71, layer insulating films 74, 77 and 78 and a polycrystalline Si film must be deposited on the substrate 71 at as many times. If the plurality of layers are deposited in such a manner, the layer insulating film on the underlayer wiring is larger in thickness than the layer insulating film on the contact hole enough to fill the contact hole with the insulating film, so that it is impossible to form the contact holes in self-alignment.

To overcome the above-mentioned problems, the present invention is directed to a method of manufacturing a semiconductor memory in which a contact hole assuredly making a contact with a diffused region of the semiconductor substrate can be formed while good yields of semiconductor memories can be attained even if the accuracy in the alignment of patterns in light projection and exposure is unsatisfactory.

SUMMARY OF THE INVENTION

According to the present invention, a method of manufacturing a semiconductor memory comprises the steps of, on a semiconductor substrate having underlayer wiring which is composed of a plurality of gate portions provided with side walls and a diffused region between the adjacent gate portions, i) forming a layer insulating film which is smaller in thickness in the diffused region than the side walls of each of the gate portions and which is made of a material etched more easily than the material of the semiconductor substrate; ii) depositing a conductive layer of a material etched more easily than the layer insulating film, over the entire surface of the layer insulating film; iii) removing the conductive layer simply except a portion where a contact hole is to be formed in the diffused region by etching with a pattern film for forming the contact hole; iv) depositing an insulating film and a pattern film for forming the contact hole over the entire surface again; and v) removing the insulating film, the remaining conductive layer and the layer insulating film by etching one after another to form the contact hole extending to the diffused region in self-alignment, and forming a toothed projection of the insulating film which remains after the etching at an upper opening of the contact hole by removing the pattern employed for forming the contact hole.

Also, according to the present invention, a method of manufacturing a semiconductor memory comprises the steps of, on a semiconductor substrate having underlayer wiring which is composed of a plurality of gate portions provided with side walls and a diffused region between the adjacent gate portions, i) forming a layer insulating film which is smaller in thickness in the diffused region than the side walls of each of the gate portions and which is made of a material etched more easily than the material of the semiconductor substrate; ii) depositing a conductive layer of a material etched more easily than the layer insulating film, over the entire surface of the layer insulating film; iii) removing the conductive layer simply except a portion where a contact hole is to be formed in the diffused region, by etching with a pattern film for forming the contact hole; iv) depositing an insulating film and a pattern film for forming the contact hole over the entire surface again; v) removing the insulating film, the remaining conductive layer and the layer insulating film by etching one after another to form the contact hole extending to the diffused region in self-alignment, and forming a toothed projection of the insulating film which remains after the etching at an upper opening of the contact hole by removing the pattern employed for forming the contact hole; vi) depositing a polysilicon film doped with an impurity at high concentration to fill and cover the contact hole having a projection and patterning the polysilicon film by light projection and exposure, and reactive ion etching to form a capacitor lower electrode; and vii) further depositing a polysilicon film doped with an impurity at high concentration through a capacitor insulating film of a SiN film and patterning the polysilicon film by light projection and exposure, and reactive ion etching to form a capacitor upper electrode.

In the aspect of the present invention, preferably, the semiconductor substrate is a Si substrate, the layer insulating film is a SiO$_2$ film, and the conductive layer is a polysilicon layer.

In another aspect of the present invention, a method of manufacturing a semiconductor memory comprises the steps of, on a semiconductor substrate having underlayer wiring which is composed of a plurality of gate portions provided with side walls and a diffused region between the adjacent gate portions, i) forming a layer insulating film which is smaller in thickness in the diffused region than the side walls of each of the gate portions and which is made of a material etched more easily than the material of the semiconductor substrate; ii) etching the layer insulating film with a pattern film for forming a contact hole to form the contact hole extending to the diffused region in self-alignment, and forming a toothed projection of the insulating film which remains after the etching at an upper opening of the contact hole by removing the pattern employed for forming the contact hole; iii) depositing a conductive layer of a material etched more easily than the layer insulation film over the entire surface of the layer insulating film having the contact hole having a projection; iv) removing by etching the conductive layer only except the portion where the contact hole is to be formed in the diffused region so as to fill the contact hole with the remaining conductive layer which is to serve as a buried film; and v) depositing an insulating film over the entire surface and forming a through-hole for connecting bit line on the buried film in the insulating film to connect the bit line through the through-hole and the buried film to the diffused region. In this case, preferably, the semiconductor substrate is a Si substrate, the layer insulating film is a SiO$_2$ film, and the conductive layer is a polysilicon layer.

In still another aspect of the present invention, the following two manufacturing methods are provided. First, a method of manufacturing a semiconductor memory comprises the steps of, on a semiconductor substrate having underlayer wiring which is composed of a plurality of gate portions provided with side walls and a diffused region between the adjacent gate portions, i) forming a layer insulating film which is smaller in thickness in the diffused region than the side walls of each of the gate portions and which is made of a material etched more easily than the material of the semiconductor substrate; ii) depositing a conductive layer of a material etched more easily than the layer insulating film, over the entire surface of the layer insulating film; iii) removing the conductive layer simply except two portions where two contact holes for a capacitor electrode and bit line are to be formed in the diffused region, by etching with a pattern film for forming the contact holes; iv) depositing an insulating film over the entire surface and then etching back the insulating film to leave the insulating film only on the wall close to the remaining conductive layers and forming a toothed projection of the remaining insulating film in position corresponding to an upper opening of a contact hole formed in the following step; v) removing the remaining conductive layer by etching; and vi) etching back the layer insulating film to form the contact holes having the toothed projection at its upper opening in self-alignment. Second, another method of manufacturing a semiconductor memory comprises the steps of, on a semiconductor substrate having underlayer wiring which is composed of a plurality of gate portions provided with side walls and a diffused region between the adjacent gate portions, i) forming a layer insulating film which is smaller in thickness in the diffused region than the side walls of each of the gate portions and which is made of a material etched more easily than the material of the semiconductor substrate; ii) depositing a conductive layer of a material etched more easily than the layer insulating film, over the entire surface of the layer insulating film; iii) removing the conductive layer simply except two portions where two contact holes for a capacitor electrode and bit line are to be formed in the diffused region, by etching with a pattern film for forming the contact holes; iv) depositing an insulating film over the entire surface and then etching back the insulating film to leave the insulating film only on the wall close to the remaining conductive layers and forming a toothed projection of the remaining insulating film in position of an upper opening of a contact hole formed in the following step; v) removing the remaining conductive layer by etching; vi) etching back the layer insulating film to form the contact holes having the toothed projection at its upper opening in self-alignment; vii) depositing a polysilicon film doped with an impurity at high concentration to fill and cover the contact holes having projections and etching back it to form in advance a buried layer of polysilicon in the contact holes making a contact with overlayer wiring. In this case, preferably, the semiconductor substrate is a Si substrate, the layer insulating film is a SiO$_2$ film, and the conductive layer is a polysilicon layer.

PREFERRED EMBODIMENTS

The most significant characteristic of the present invention is in that a contact hole extending to a diffused region in a memory cell is formed in self-alignment and also in that a capacitor electrode is formed by utilizing a toothed projection of an insulating film formed in an upper opening having a capacitor electrode.

In the present invention, first, on a semiconductor substrate a layer insulating film of a material which is more easily etched than the material of the semiconductor substrate is formed. For example, a $SiO_2$ film is formed on a Si substrate.

Then, a conductive layer of a material which is more easily etched than the material of the layer insulating film is deposited over the entire surface of the layer insulation film; and eventually, the conductive layer and layer insulating film in a portion where a contact hole is to be formed are removed by etching one after another to form the contact hole extending the diffused region. In this way, the contact hole can be formed in self-alignment. The method of forming a contact hole may be a known method; however, the inventors of the present invention apply the above-mentioned method of forming a contact hole to the formation of a contact hole for forming a capacitor electrode of a memory cell to attain a high integration of a memory and good yields of memories.

An essential requirement in the present invention is that the layer insulating film is smaller in thickness in the diffused region that side walls of a gate portion. For example, an example is shown in FIG. 12 where a contact hole is formed in a layer insulating film without self-alignment as in the present invention.

Figure 12A:
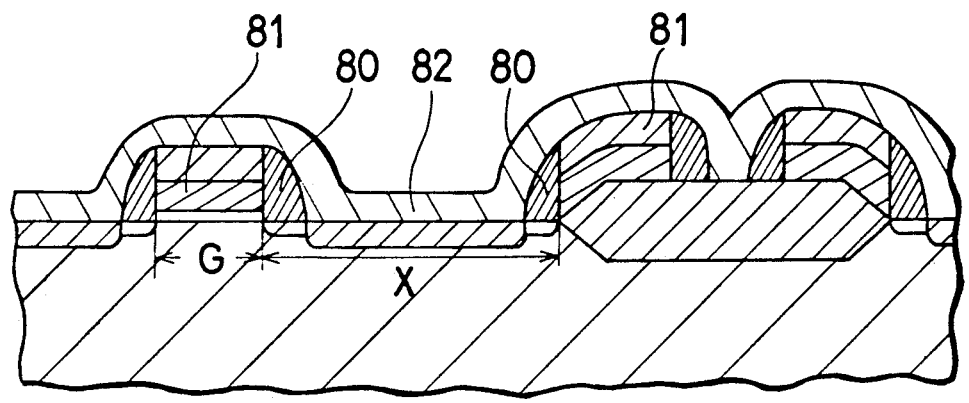
FIG. 12 is a diagram for explaining the accuracy of the alignment in an exposure device in the steps of forming a contact hole without a self-alignment method.

In FIG. 12(a), a layer insulating film 82 is formed on a semiconductor substrate having underlayer wiring which is composed of a plurality of gate portions 81 having side walls 80 and a diffused region. In this case, the distance x between the gates is 1.1-1.2 $\mu$m while the length G of the gate is 0.8 $\mu$m or under, desirably 0.5-0.6 $\mu$m.

Figure 12B:
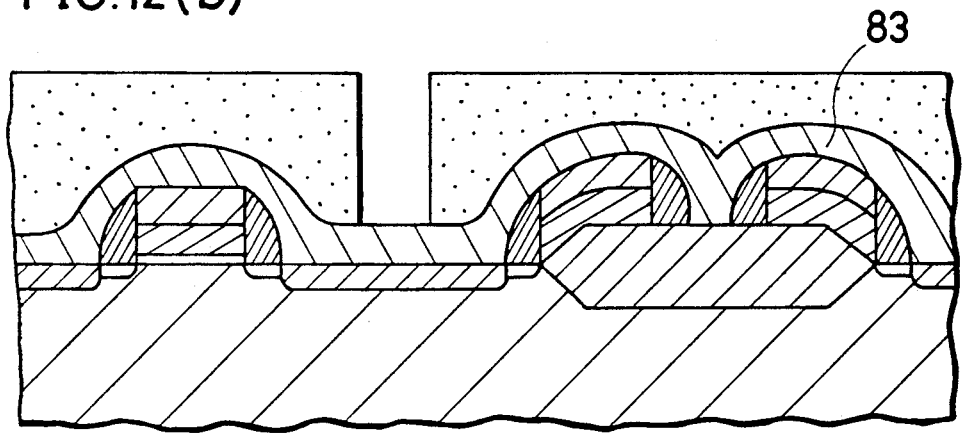
Figure 12C:
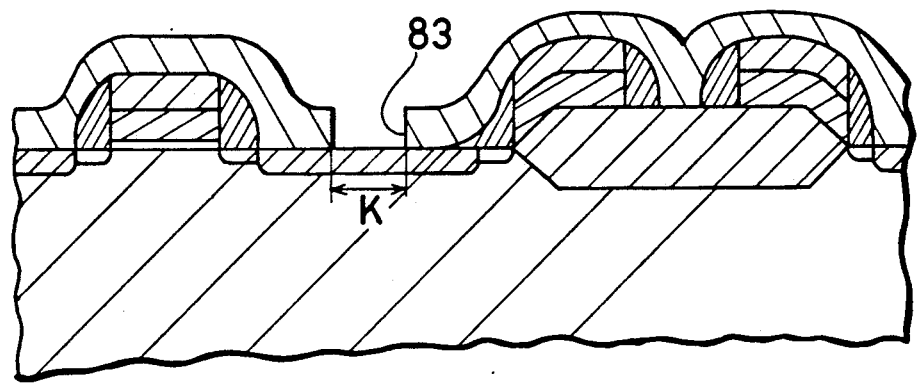

Then, as shown in FIG. 12(b), a resist film 83 for forming a contact hole is formed.

Then, the layer insulating film is patterned by light projection and exposure, and reactive ion etching to form a contact hole 83. The diameter K of the contact hole 83 is 0.3 $\mu$m.

In the above-mentioned method of forming a contact hole, it is known that the distance x between the gates cannot be reduced to 1.1-1.2 $\mu$m or under because of the accuracy of the alignment of the exposure device. Thus, it is necessary to arrange in advance that the adjacent gates are disposed with the distance x of 1.1-1.2 $\mu$m or over before the contact hole is formed. On the other hand, in the present invention, the distance x can be reduced to 0.5-0.6 $\mu$m. This results in high integration of the memory. For that purpose in the present invention, as shown in FIG. 1(b), a conductive film 8 is formed for increasing in a margin of the alignment in forming a contact hole 40 [see FIG. 1(e)]. The conductive film 8 also functions as a dummy, which is removed when the contact hole is formed. Thus, after the removal of the conductive film 8, a capacitor electrode can increase in area for wiring by an area the conductive film covers.

Since the conductive film 8 is formed in forming the contact hole 40 to increase in a margin of the alignment, the alignment of patterns in a projection and exposure may be performed with little accuracy; and therefore, good yields can be expected of this in manufacturing.

Figure 1A:
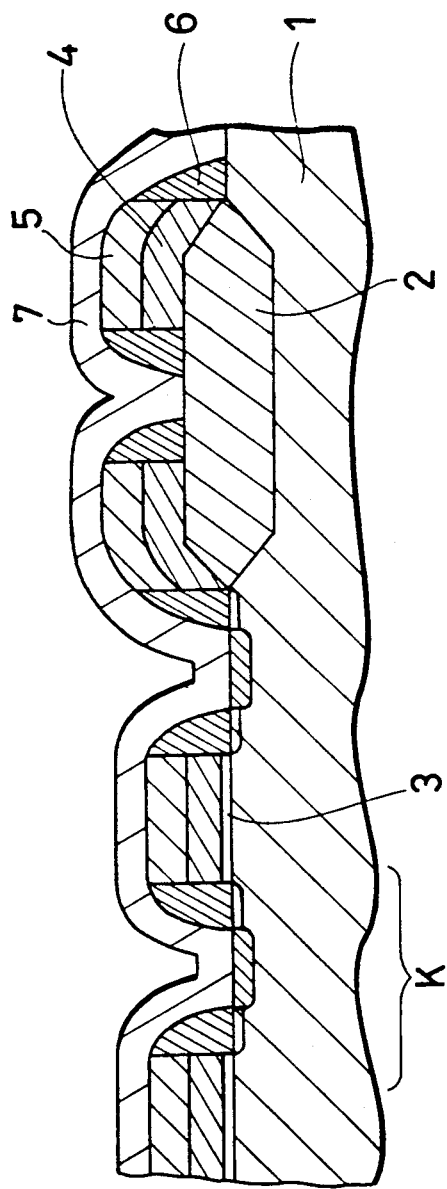
FIG. 1 is a diagram for explaining the steps of forming a capacitor electrode in a manufacturing method of an embodiment according to the present invention.
Figure 1B:
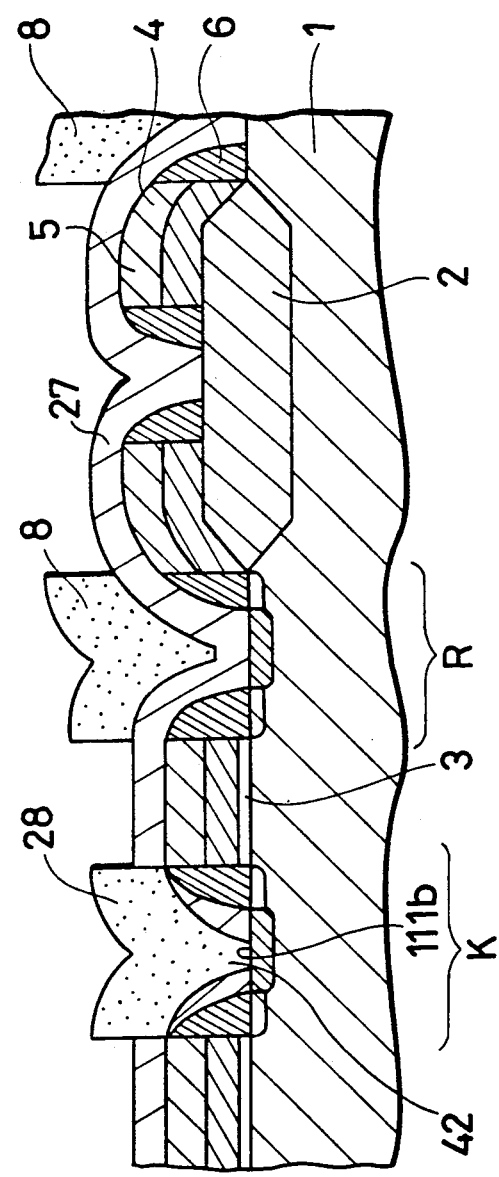
Figure 1C:
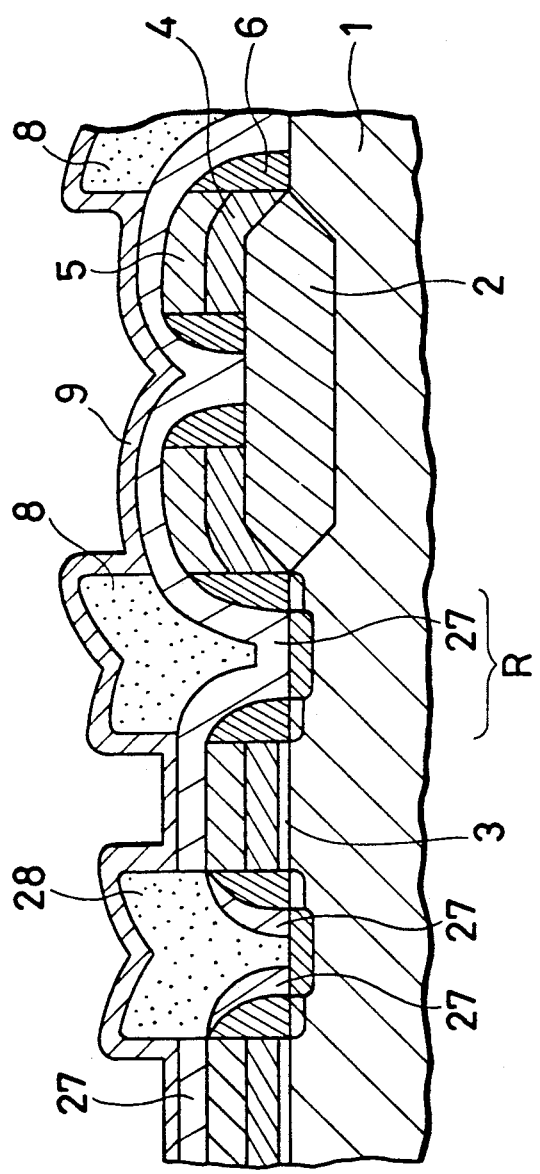
Figure 1D:
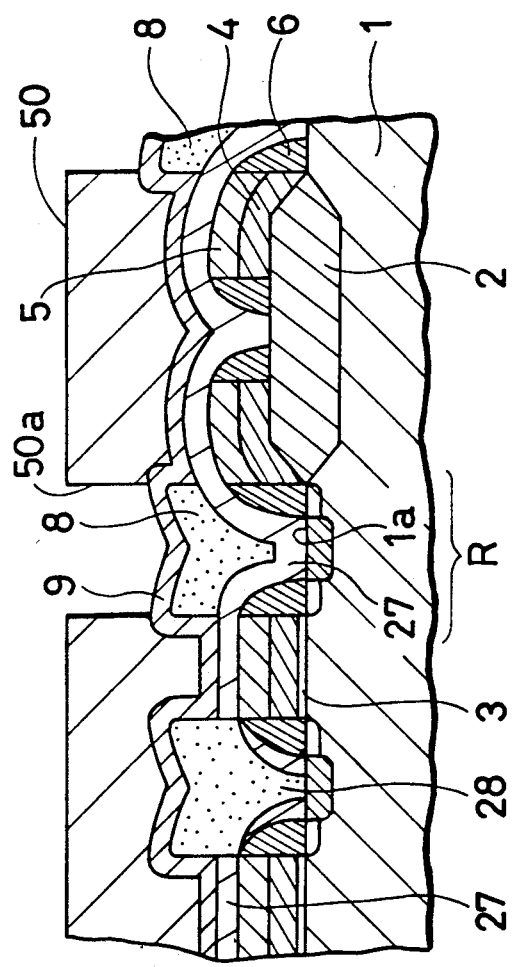
Figure 2B:
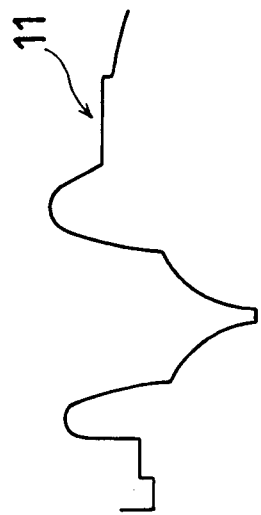
FIGS. 2(a) and 2(b) are diagrams for explaining a configuration of a main portion, showing a contact hole for making a contact with the capacitor electrode and a capacitor insulating film of the embodiment.
Figure 2A:
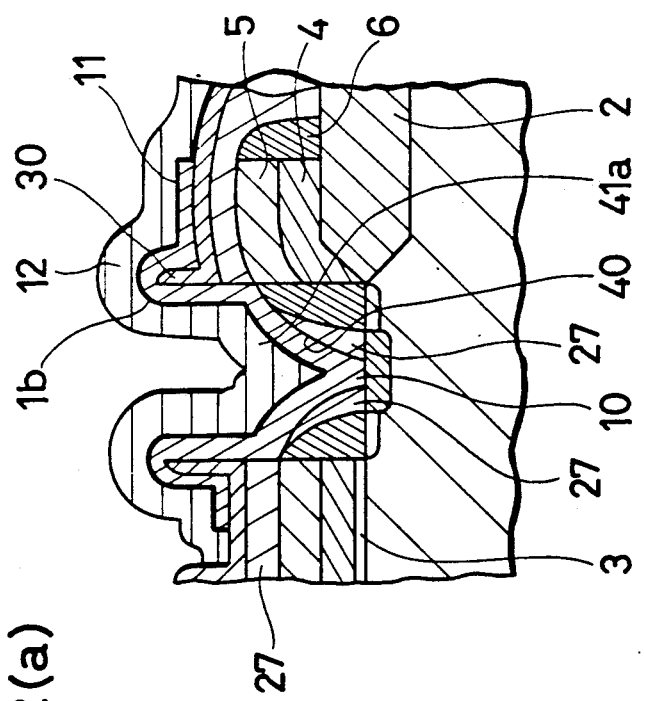
Figure 13:
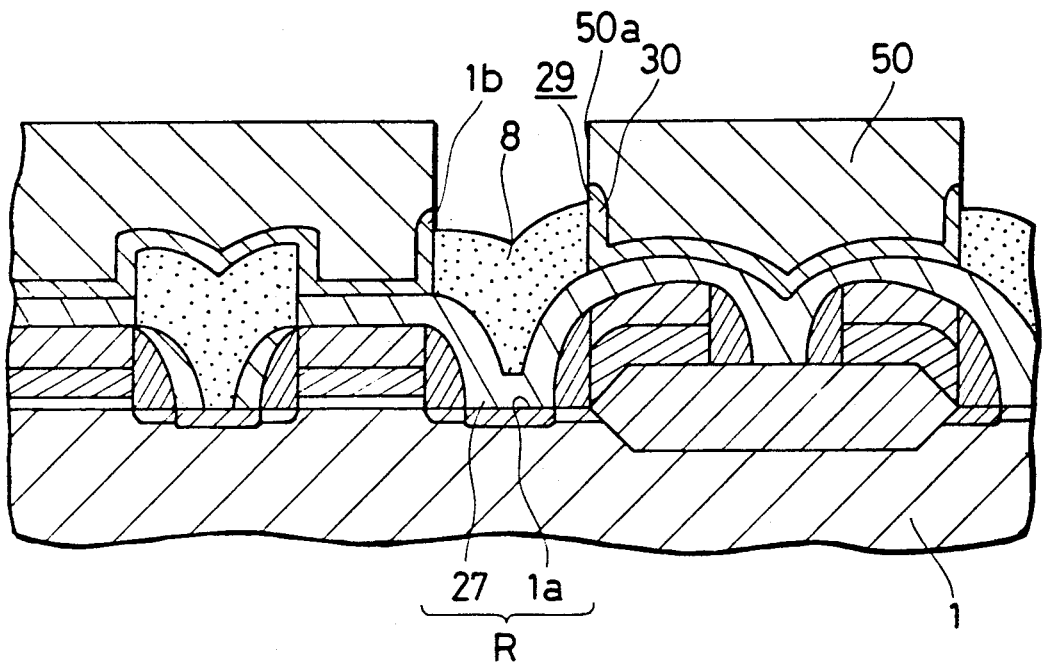
FIG. 13 is a diagram for explaining the manufacturing steps corresponding to the steps of the first embodiment shown in FIGS. 1(d) to 1(e) in detail.
Figure 13:
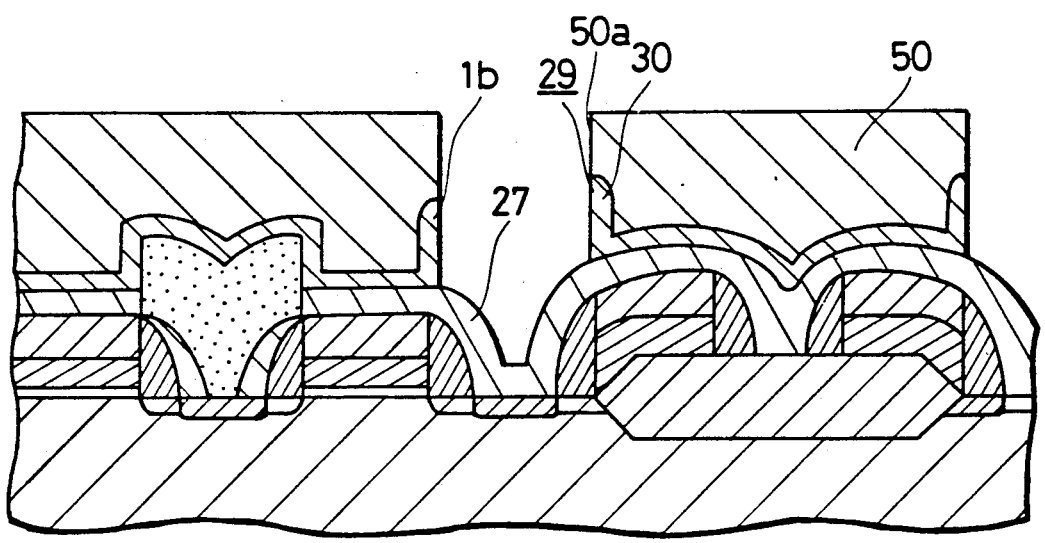
Figure 13:
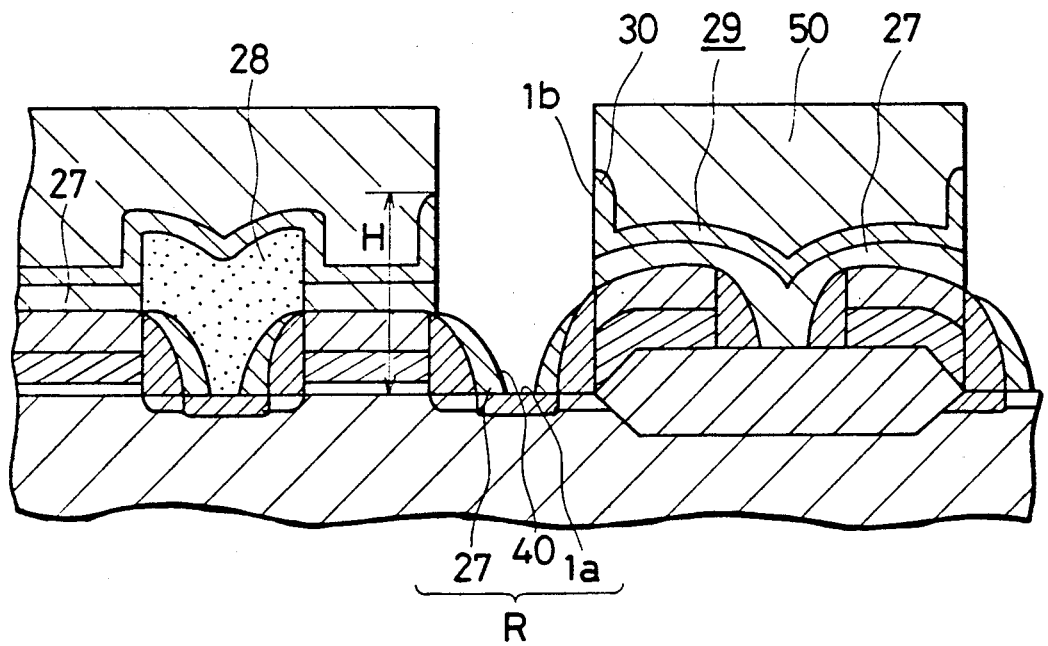

The contact hole 40 in the present invention is formed, for example, in the following way. A region R where a contact hole is to be formed is removed by an anisotropic reactive ion etching (RIE) with a mask of a resist pattern 50 formed by a projection and exposure, and then, a second layer insulating layer 9, the conductive film 8 and a first layer insulating film 27 are removed one after another by etching. The bottom face of the contact hole 40, as shown in FIG. 1(e), defines a interface 1a to the surface of one of diffused regions, while an upper opening 1b, or the rim, of the contact hole 40 extends from a second insulating layer 29 to project upwards; a large level difference H between the upper opening 1b and the bottom face 1a is observed [see FIG. 1(e), FIG. 2]. In addition to that, since the capacitor electrode 41 can be formed by utilizing the projection 30, the capacitor electrode 41 can increase in area by the area surrounded by the projection 30 much more than the capacitor electrode 241 having no such projection as the projection 30 in this embodiment even if the contact hole 24 is formed with a projection area identical with that of the resist pattern 50 formed by projection and exposure (see FIG. 13). Thus, the capacitor electrode 41 can have much more accumulated capacity than the capacitor electrode 241 which has no such projection as the projection 30. An increase in the accumulated capacity corresponds to an increase in the area of the capacitor electrode 41, and the increase in the area of the capacitor electrode 41 is in agreement with the area surrounded by the projection 30; hence, for example, if the capacitor electrode 41 increases in area 20% more than the capacitor electrode 241 in FIG. 15 because of the projection 30, the capacitor electrode 41 increases in accumulated capacity 20% more than the capacitor electrode 241. The conductive film 8 serving as a dummy [seen FIGS. 1(c) and 1(d)] is removed when the contact hole 40 is formed; instead, an area for wiring can be accordingly increased in the depthwise direction. Thus, capacitor electrode overlayer wiring provided along the inner wall of the contact hole can increase in the area of its wiring. In other words, creating a large level difference in the contact portion between the capacitor electrode and the diffused region increases in the area of the capacitor electrode.

Figure 3C:
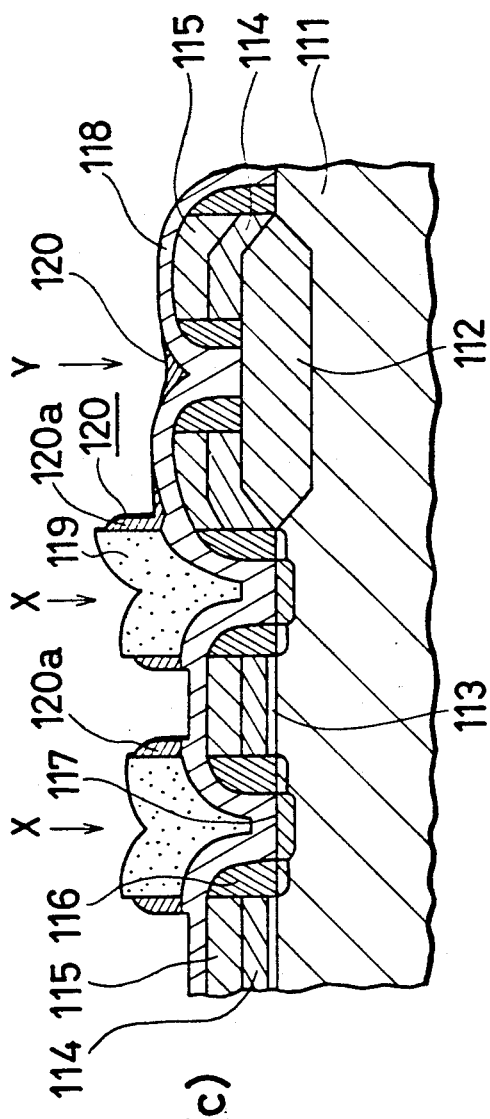
FIG. 3 is a diagram for explaining the steps of forming a capacitor electrode in a manufacturing method of another embodiment according to the present invention.
Figure 3D:
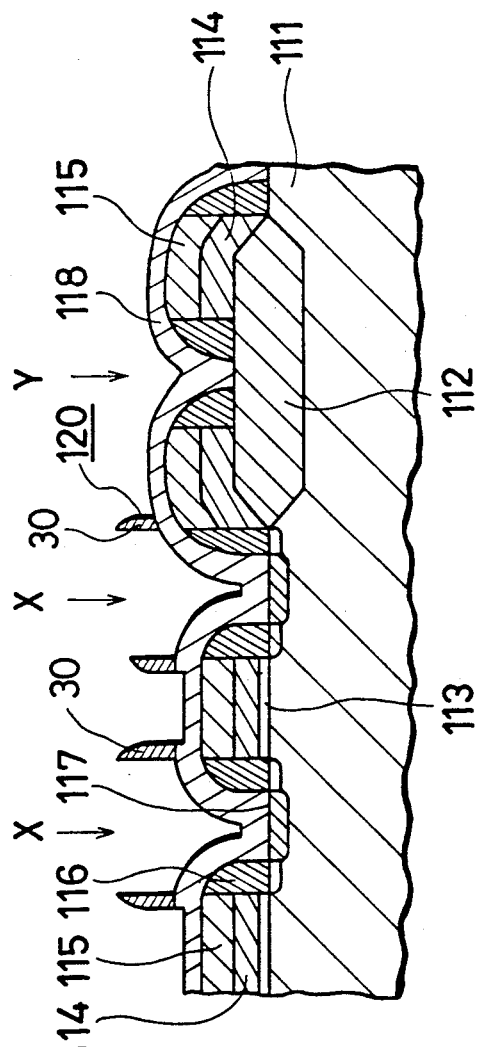
Figure 3E:
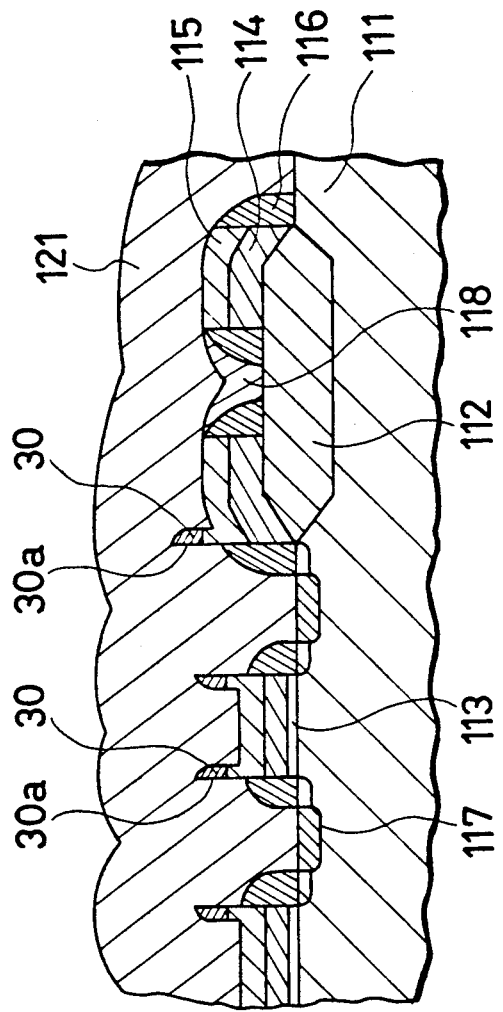
Figure 3F:
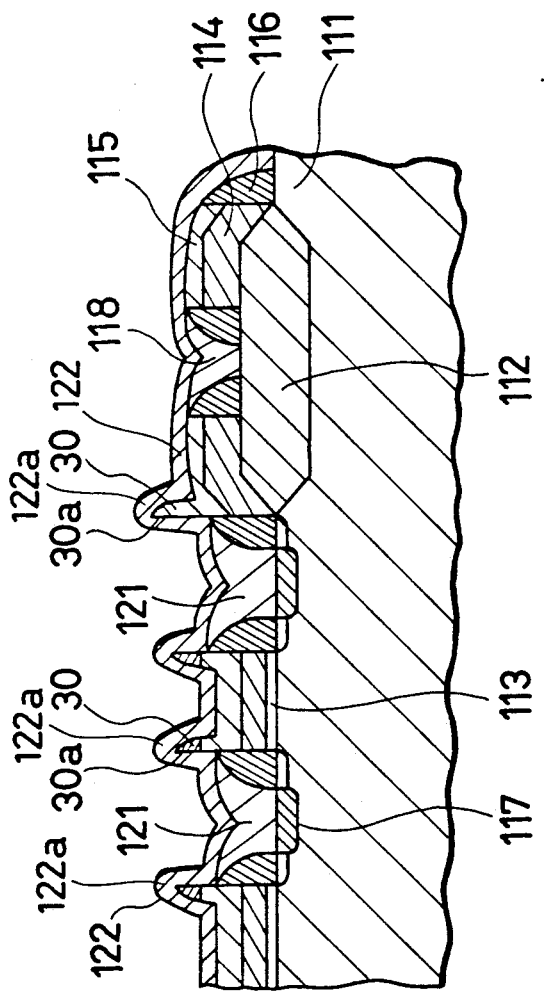
Figure 4:
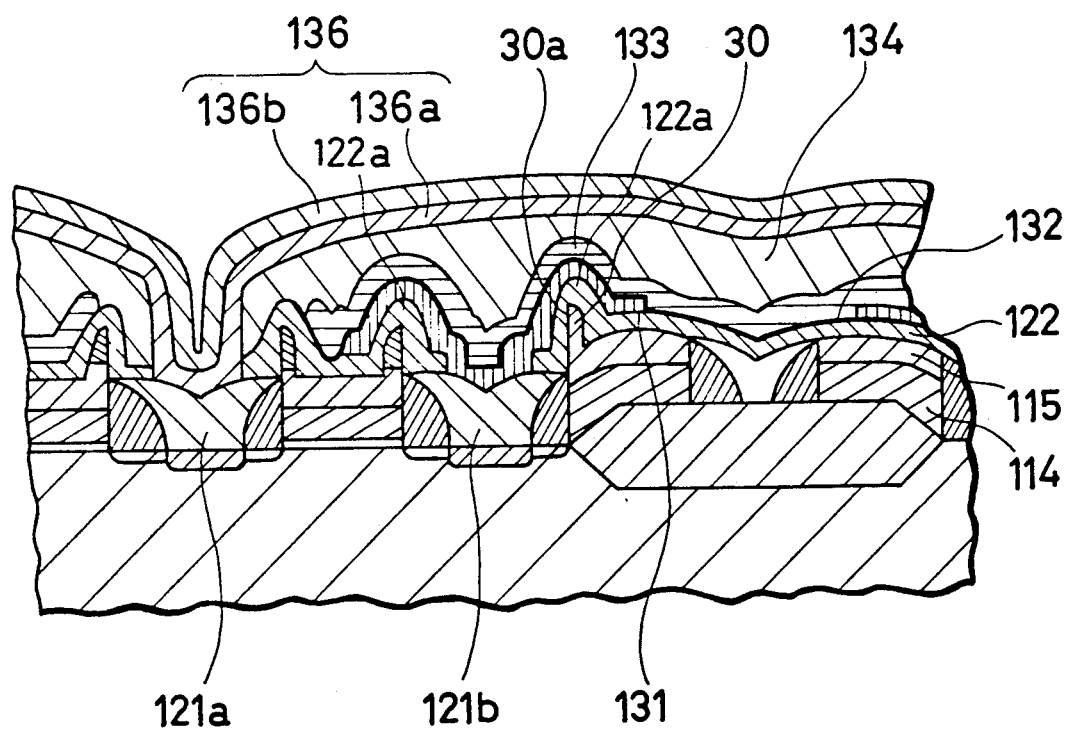
FIG. 4 is a diagram for explaining a configuration of a main portion, showing a memory formed in accordance with the embodiment.
Figure 5A:
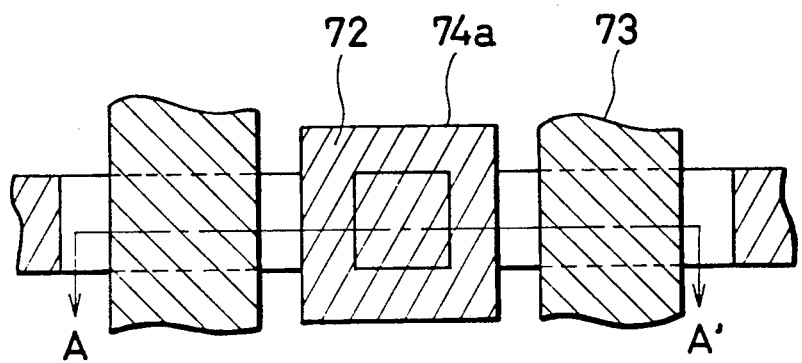
FIG. 5(a) is a diagram for explaining a configuration of a prior art semiconductor memory, showing a contact hole.
Figure 5B:
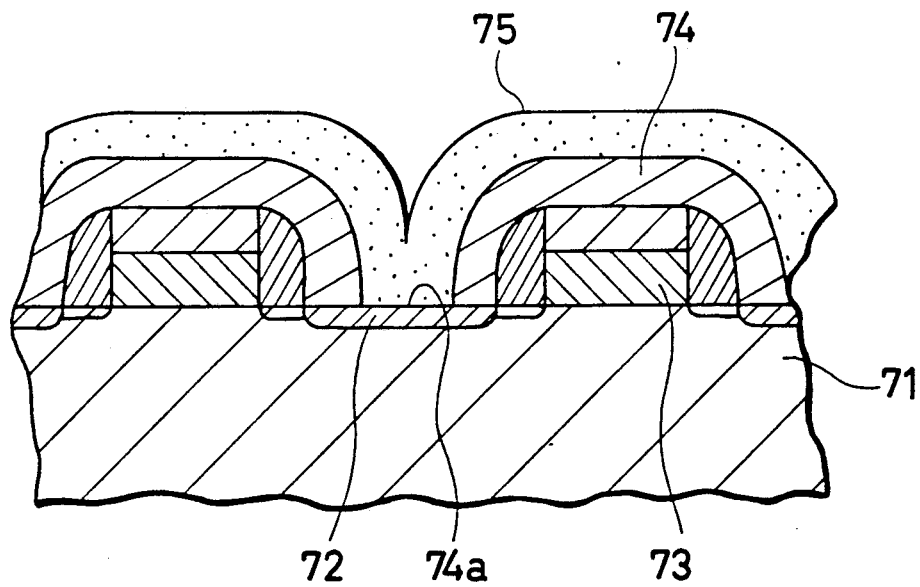
FIG. 5(b) is a sectional view taken along the line A—A' of FIG. 5(a)
Figure 6:
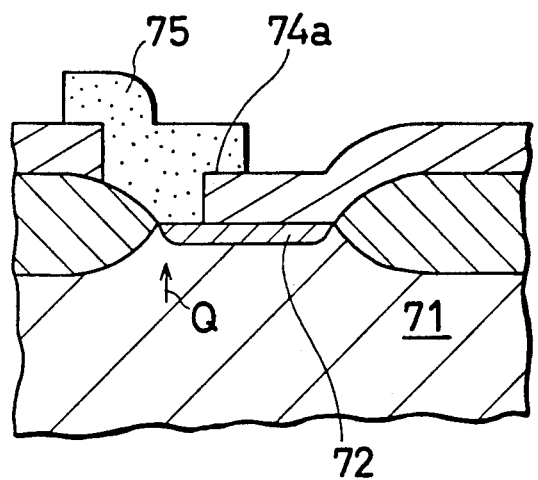
FIG. 6 is a diagram for explaining drawbacks of the prior art semiconductor memory, showing its configuration.
Figure 7:
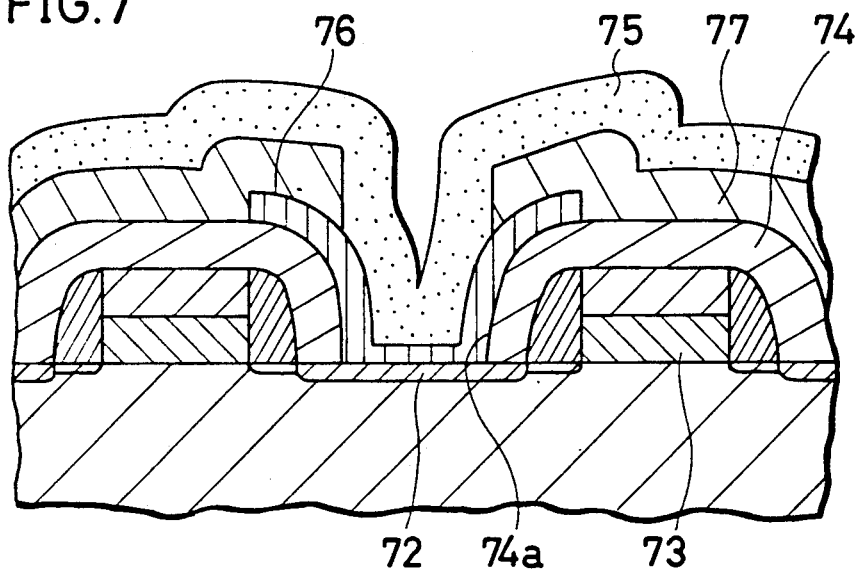
FIG. 7 is a diagram for explaining an improved prior art semiconductor memory, showing its configuration.
Figure 8:
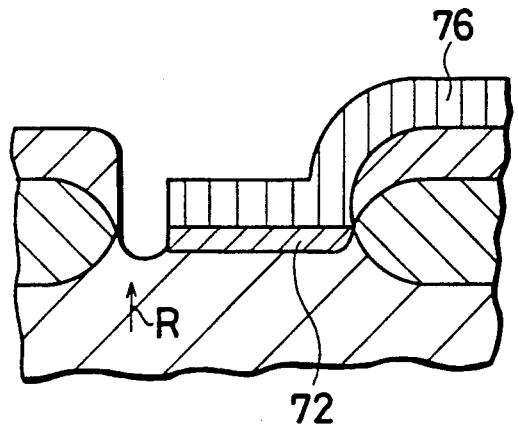
FIGS. 8 through 11 are diagrams for explaining drawbacks the improved prior art semiconductor memory, showing its configuration.
Figure 9:
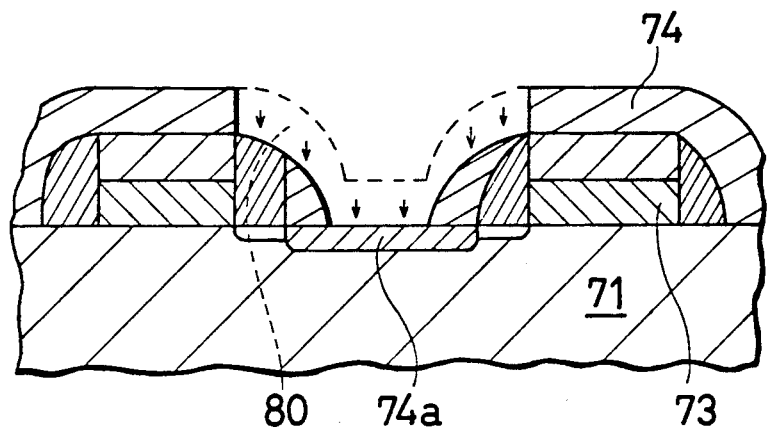
Figure 10:
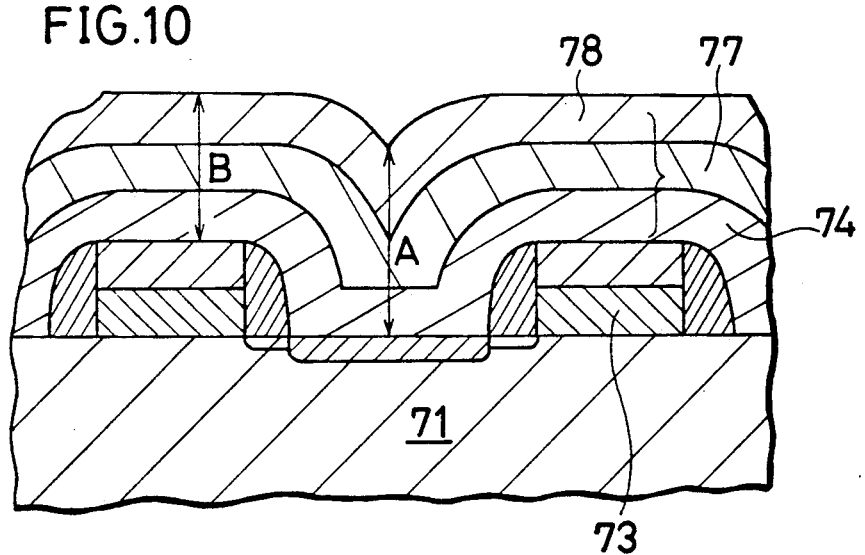
Figure 11:
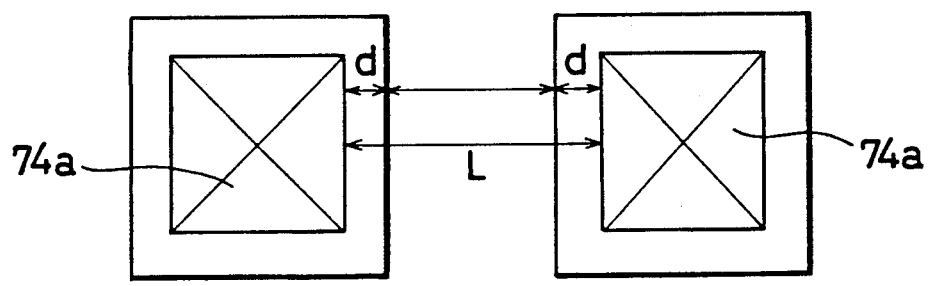
Figure 15:
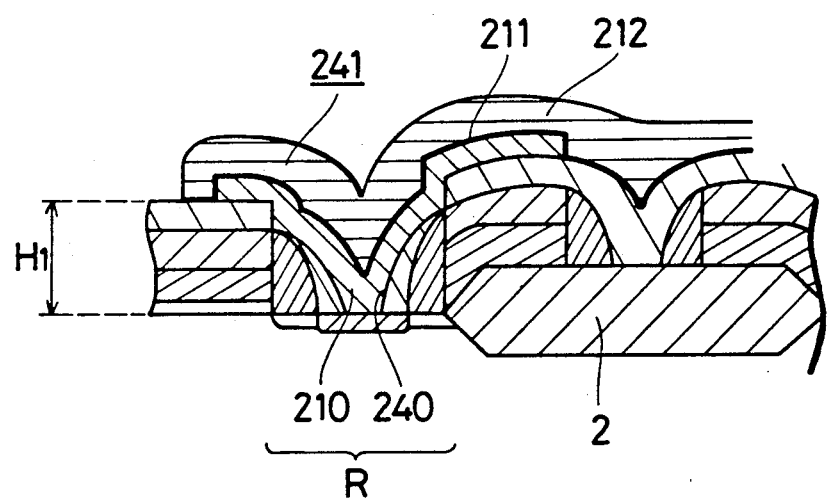
FIG. 15 is a diagram showing a configuration of a major portion of an embodiment presented for a comparison with a manufacturing method in the first embodiment.

Also, from the viewpoint of an increase in the accumulated capacity, since the capacitors 131, 132 and 133 can be formed by utilizing the projection 30 shown in FIG. 3(e) and FIG. 4, the capacitors 131, 132 and 133 can increase in the total area by the area surrounded by the projection 30 much more than the capacitor electrode 241 having no such projection as the projection 30 (see FIG. 15). Thus, the capacitors 131, 132 and 133 can have the total accumulated capacity larger than the accumulated capacity of the capacitor electrode 241 having no projection. Further, as shown in FIG. 3(f) and FIG. 4, since the projection 30 is covered with a region 122a of the insulating film 122, an area corresponding to the region 122a is added to the total area of the capacitors 131, 132 and 133, so that the accumulated capacity can be accordingly increased.

Preferably, the conductive layer in the present invention may be the one that could be removed more rapidly than a $SiO_2$ film by anisotropic etching like RIE; the best example is a polycrystalline silicon film. A silicide film of WSi or the like overlaid with a poly Si film may be used.

The conductive layer is, for example, removed by anisotropic reactive ion etching (RIE) with a photoresist pattern formed by the projection and exposure, and a conductive film and a conductive buried film are formed.

In another aspect of the present invention, a contact hole for connecting bit line through its opening and a buried film to a diffused region can be formed in self-alignment. As a result, the cell can be miniaturized. In this case, the buried film is useful for increasing a margin of the alignment.

In still another aspect of the present invention, a conductive film (e.g., a polysilicon film) which is etched more rapidly is deposited on a layer insulating film and patterned; thereafter, an insulating film is formed to form a contact hole. In this way, the contact hole can be assuredly formed in an area where the contact hole should be formed. The contact hole is filled with polycrystalline Si of high impurity concentration; and thus, when wiring formed by depositing conductive material on the semiconductor substrate is electrically connected to wiring formed by diffusion or the like in the semiconductor substrate, the wiring of the semiconductor substrate can be assuredly drawn out on the semiconductor substrate. In this way, a memory which holds a reliability on the connection of wirings can be created.

The present invention will be explained below in detail in conjunction with embodiments shown in the drawings; it is not intended that the present invention be limited to the precise form disclosed therein.

EMBODIMENT

Figure 1G:
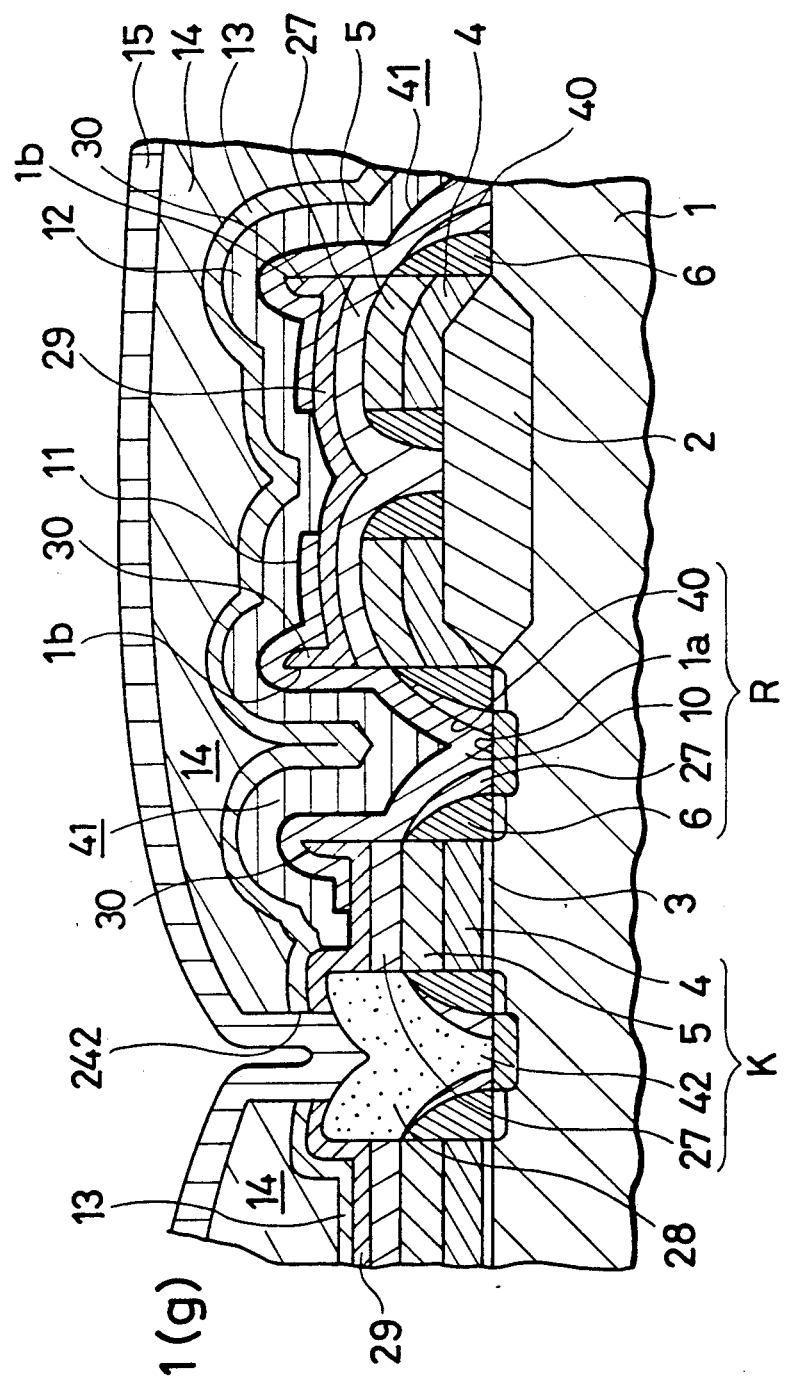

Referring to FIG. 1(g), a DRAM (MOS transistor) is mainly composed of a Si substrate 1 of which elements are isolated by a $SiO_2$ thermal oxidation film having a thickness of approximately 0.4 μm, a polycrystalline Si film (gate wiring serving as lead) 4 formed on the substrate 1 with a thickness of about 3000 Å by diffusing phosphorus (P) at high concentration through a gate oxidation film 3 having a thickness of about 100 Å, $SiO_2$ spacers 5 and 6 formed by anisotropic ion reactive etching (RIE) after a deposition of $SiO_2$ on the upper and side faces of the gate wiring by CVD, a layer insulating $SiO_2$ film 27 formed by CVD to cover it and to have a thickness of about 0.2 μm, a contact hole 40 formed on one of diffused regions, R, with a large level difference H of about 1.2 μm between the upper opening 1b and the bottom face 1a [see FIG. 1(e)], a bit line connecting contact-hole 242 formed on the other of the diffused regions, K, through the polycrystalline Si film 28 having a thickness of about 0.5 μm, a $SiO_2$ 29 deposited on the Si substrate by CVD with a thickness of about 0.1 μm and a capacitor electrode overlayer wiring 41 provided with the contact hole interposed, both of which are provided on a region except the diffused region K, a $SiO_2$ film 13 formed by CVD with a thickness of about 0.1 μm and a fourth layer insulating film 14 formed by CVD with a thickness of about 0.3 μm for flattening, both of which are deposited on the $SiO_2$ film 29 one after another, and overlayer bit-wiring 15 formed by light projection and exposure and anisotropic RIE after a deposition of a WSi film of about 0.3 μm thickness on the $SiO_2$ film 14 including an opening 242 above a contact hole 42.

The upper opening 1b of the contact hole 40 having the capacitor electrode 41 has a toothed projection 30 of the $SiO_2$ film 29. The projection has a height $H_2$ of 0.4 to 0.6 μm (see FIG. 14).

The capacitor electrode 41 is composed of a capacitor lower electrode 10 which is formed in the lower layer by depositing a polycrystalline Si of about 500 Å thickness film doped with phosphorus (P) at high concentration by CVD and patterning it by light projection and exposure, and anisotropic RIE, and a capacitor upper electrode 12 which is formed in the upper layer through a SiN capacitor insulating film 11 of about 80 Å thickness by light projection and exposure, and anisotropic RIE after a deposition of a polycrystalline Si film doped with P at high concentration of about 1500 Å thickness.

Then, manufacturing methods will be explained.

(i) First, all over the Si substrate 1 which includes a gate electrode 4 having the upper side 5 of the spacer of $SiO_2$ and the side face (side wall) 6 of the spacer of $SiO_2$, a $SiO_2$ film serving as an insulating layer and a resist layer (not shown) are deposited one after another [see FIG. 1(a)], and a resist film of a specific pattern is formed; thereafter, (ii) with a mask of the resist film, simply the $SiO_2$ film 7 on the diffused region K is removed by anisotropic RIE until the surface 111b of the diffused region K is partly exposed. After that, all over the Si substrate 1 including the remaining $SiO_2$ film 27, a polycrystalline Si layer (not shown) serving as a conductive layer of a material etched more rapidly than the SiO₂ film 27 and a resist layer (not shown) are deposited one after another, and a resist film of a specific pattern is formed; thereafter, (iii) with a mask of the resist film, the conductive layer is etched so that the conductive film 8 remains through the SiO₂ film 27 on the diffused region R while the conductive buried film 28 electrically connecting to the diffused region K remains on the diffused region K [see FIG. 1(b)].

(iv) All over the first layer insulating film 7 including the conductive film 8 and the conductive buried film 28, a SiO₂ film 9 and a resist layer (not shown) are deposited one after another [see FIG. 1(c)], and a resist film 50 of a specific pattern for forming a contact hole is formed [see FIG. 1(d)]; thereafter, (v) with a mask of the resist film 50, the SiO₂ film 9 and conductive film 8 on the diffused region R are etched one after another, and further, the SiO₂ film 27 just under the conductive film 8 is removed until it is partly exposed on the interface 1a to the substrate 1 in the diffused region R to form the contact hole 40 which has its upper opening 1b defined by the toothed projection 30 and the SiO₂ film 29 [see FIG. 1(e)].

The formation of the contact hole 40 will be described in detail with reference to FIGS. 13(a) to 13(c).

First, in FIG. 1(d), the resist pattern 50 for forming the contact hole 40 is formed by projection and exposure on the SiO₂ film 9 in part except for an area where the capacitor electrode 41 is to be formed. In other words, a resist hole 50a is formed in the area where the capacitor electrode 41 is to be formed by using the resist pattern 50.

Then, as shown in FIG. 13(a), the resistor pattern 50 is used as a mask and the SiO₂ film 9 is etched by a well-known technique. The remnant of the SiO₂ film 9 which is not etched away because of the protection of the resist pattern 50 is the SiO₂ film 29. At this time, the toothed SiO₂ film 29 is exposed in the circumference at the bottom of the resist hole 50a. The exposed projection is the upper opening 1b of the contact hole 40 formed as shown in FIG. 13(c).

Then, as shown in FIG. 13(b), with the mask of the resist pattern 50, the poly Si conductive film 8 is etched by a well-known technique. As a result, the SiO₂ film 27 is exposed and a region for a capacitor electrode is defined with an area corresponding to the surface area of the conductive film 8. Also, the SiO₂ film 29 is exposed in height H₂ in the circumference at the bottom of the resist hole 50a.

Figure 14:
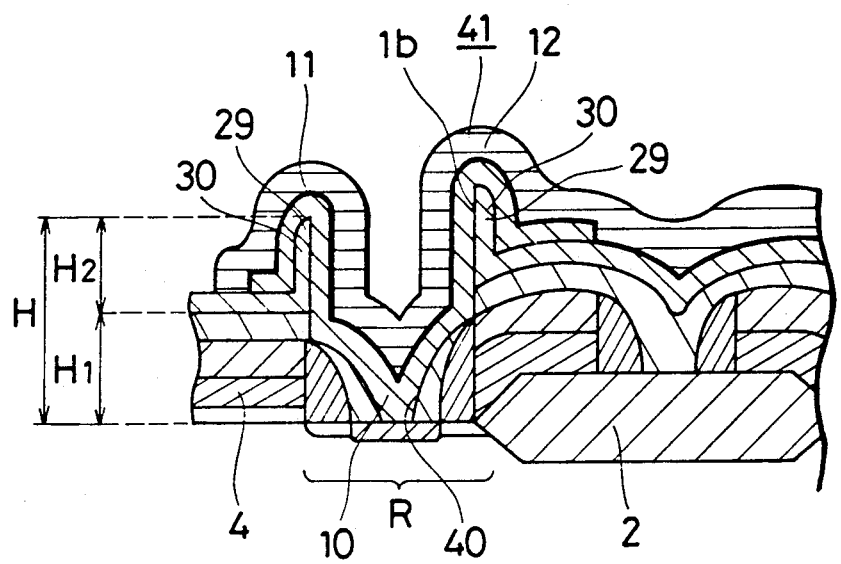
FIG. 14 is a diagram showing a configuration of a major portion of the first embodiment.

Then, as shown in FIG. 13(c), similarly with the mask of the resist pattern 50, the SiO₂ film 27 is etched by a well-known technique. As a result, a surface of the Si substrate 1, which is to be the bottom face 1a of the contact hole 40, is exposed. Thus, a region for the capacitor electrode is additionally defined with an area corresponding to the surface area of the SiO₂ film 27 which has been etched. With the above-mentioned steps, as shown in FIG. 14, the contact hole 40 is formed with height H of 0.8 to 1.2 μm in a region R, and at the same time, the projection 30 is formed with height H₂ of 0.4 to 0.6 μm. Then, the resist pattern 50 is removed. FIG. 1(e) shows the end result after the resist pattern 50 is removed.

(vi) Then, on the Si substrate 1 except the diffused region region K or other, the capacitor electrode 41 is formed [see FIG. 1(f)].

The capacitor electrode 41 is composed of a capacitor lower electrode 10 which is formed in the lower layer by depositing a polycrystalline Si of about 500 Å thickness film doped with phosphorus (P) at high concentration by CVD and patterning it by light projection and exposure, and anisotropic RIE, and a capacitor upper electrode 12 which is formed in the upper layer through a SiN capacitor insulating film 11 of about 80 Å thickness by light projection and exposure, and anisotropic RIE after a deposition of a polycrystalline Si film doped with P at high concentration of about 1500 Å thickness. Thus, the contact hole 40 is filled with the capacitor upper electrode 12 and the capacitor lower electrode 10.

(vii) Moreover, all over the Si substrate 1 including the capacitor electrode 41, the SiO₂ film 13 and the SiO₂ film 14 for flattening are deposited one after another, and then, the SiO₂ films 13, 14 on the conductive buried film 28 are removed to form a contact hole (bit line contact hole) 242.

(viii) All over the SiO₂ film 14 including the contact hole, the bit line 15 of a specific patter is formed [see FIG. 1(g)].

In this way, a DRAM memory cell is configured.

In this embodiment, after the word line 4 is formed, the poly Si patterns 8, 28 are formed on the SiO₂ film, and moreover, the SiO₂ film 9 is deposited. After that, the SiO₂ films 27, 9 in a portion where a contact hole is to be formed, in a region which is to be a capacitor electrode and one of the diffused regions of the substrate, and the conductive film 8 as a dummy in the poly Si patterns are removed by etching, and then, the capacitor electrode 41 is formed. As a result, the capacitor electrode 41 increases in its electrode area. In addition to that, since the capacitor electrode 41 can be formed by utilizing the projection 30, the capacitor electrode 41 can increase in area by the area surrounded by the projection 30 much more than the capacitor electrode 241 having no such projection as the projection 30 in this embodiment even if the contact hole 24 is formed with a projection area identical with that of the resist pattern 50 formed by projection and exposure (see FIG. 15). Thus, the capacitor electrode 41 can have much more accumulated capacity than the capacitor electrode 241 which has no such projection as the projection 30. An increase in the accumulated capacity corresponds to an increase in the area of the capacitor electrode 41, and the increase in the area of the capacitor electrode 41 is in agreement with the area surrounded by the projection 30; hence, for example, if the capacitor electrode 41 increases in area 20% more than the capacitor electrode 241 in FIG. 15 because of the projection 30, the capacitor electrode 41 increases in accumulated capacity 20% more than the capacitor electrode 241. As the area of the capacitor electrode 41 increases, the amount of electric charge accumulated at the identical writing voltage is increased; and a reliability to a soft error caused by an incident of α ray is enhanced.

The contact holes 40, 42 are formed on both the diffused layers by providing the poly Si patterns 8, 28, so that a margin of the alignment in forming the contact holes 40, 42 in the capacitor electrode contact portion and bit line contact portion can be improved.

As has been described, according to the present invention; (i) good yields in manufacturing can be expected because the alignment of the patterns in a projection and exposure can be performed with little accuracy, and (ii) an area of the capacitor electrode can be increased by using a level difference between the contact portions in the capacitor electrode and the diffused layer. Moreover, since the capacitor electrode can be formed by utilizing a projection, the capacitor electrode can increase in accumulated capacity much more than a capacitor electrode formed in a contact hole having no projection even if both the contact holes are formed by using resist patterns identical in projection area. Because of an increase in the area of the capacitor electrode, the resultant amount of accumulated electric charge can be increased under the identical writing voltage, and a reliability to a soft error can be enhanced.

EMBODIMENT 2

In FIG. 3(a), a thermally oxidized gate insulating film 113 of about 100 Å thickness is formed on a semiconductor substrate 111 of which elements are isolated by a thermal oxidation film 112 of about 0.4 $\mu$m, and gate wiring of a MOS transistor and second underlayer wiring 114 are formed on the gate insulating film 113 with a polycrystalline Si film of about 3000 Å thickness diffused with phosphorus at high concentration. On the upper and side faces of the wiring 114, spacers 115, 116 of SiO$_2$ are formed, and first underlayer wiring 117 is formed in the substrate 111 by a diffusion with masks of the spacers 115, 116. The spacers 115, 116 are formed in the following manner: SiO$_2$ is deposited by CVD, and thereafter, it is subjected to an anisotropic etching, such as reactive ion etching (RIE) or the like. A thin SiO$_2$ film 118 of about 0.2 $\mu$m for insulating layers from each other is deposited by CVD on the wirings covered with the spaces 115, 116.

As shown in FIG. 3(b), a polycrystalline Si film 119 of about 0.5 $\mu$m thickness which is different in a period of time required for etching from SiO$_2$ is deposited on the substrate, covering the SiO$_2$ film 118, and then etched by an an isotropic etching, such as RIE or the like, with a photoresist pattern formed by light projection and exposure, so as to form a dummy pattern in a portion X where a contact hole is necessary. A region between the wirings where no contact hole is necessary in this process has the insulating film 118 left by reference character Y in FIG. 3(b).

After that, a thin SiO$_2$ film 120 of about 0.1 $\mu$m thickness is deposited by CVD, and then, the surface of the substrate is etched back by an anisotropic etching, such as RIE or the like, to the depth corresponding to the thickness of the SiO$_2$ film 120 so as to form a projection 120a of the SiO$_2$ film 120, as shown in FIG. 3(c). Then, the exposed polycrystalline Si film 119 is removed by an isotropic etching, such as plasma etching or the like [see FIG. 3(d)]. Moreover, the SiO$_2$ film 118 covering the surface of the substrate is etched back by an anisotropic etching, such as RIE or the like, to the depth corresponding to the thickness of the SiO$_2$ film 118. With these steps, the substrate 111 is exposed in the portion X where the contact hole making a contact with the overlayer wiring is to be formed without losing the insulating film in the portion Y where no contact hole is necessary, and the contact hole is formed in self-alignment relative to a diffused region 117. The contact hole has the toothed SiO$_2$ projection 30 at the upper opening 30a.

After that, a polycrystalline Si film 121 of about 0.4 $\mu$m thickness which is doped with phosphorus at high concentration is deposited by CVD as shown in FIG. 3(e), and then etched back by an anisotropic etching, such as RIE or the like, to the depth corresponding to the thickness of the polycrystalline Si film 121, so as to complete the polycrystalline Si film 121 with which the contact hole is filled, as shown in FIG. 3(f). After etching back the polycrystalline Si film 121, a SiO$_2$ film 122 of about 0.2 $\mu$m thickness is formed on the surface of the substrate by CVD.

With the above-mentioned steps, the polycrystalline Si buried layer 121 covering the contact hole on the diffused region is formed in self-alignment. The pattern of the polycrystalline Si film 121 is simultaneously formed in every portion where the contact hole making a contact between the multi-layer overlayer wiring and the substrate is to be formed, so that the polycrystalline Si buried layer is formed in every contact hole in self-alignment relative to the second underlayer wiring. The buried layer 121 close to the substrate is directly in contact with the diffused region 117 on the surface of the substrate to attain an electrical connection.

After the buried layer 121 is formed, a semiconductor device having a capacitor and bit line, which are essential for forming a memory cell, formed in a multi-layer wiring configuration on the semiconductor substrate, as shown in FIG. 4.

To form the capacitor, a thin CVD SiO$_2$ film 122 which covers a buried layer 121b to connect with the capacitor is removed, and then a capacitor lower electrode 131 connected to the buried layer 121b in the portion from which the SiO$_2$ film 122 was removed is formed. Then, a capacitor insulating film 132 is formed, covering the lower electrode 131; moreover, a capacitor upper electrode 133 is deposited.

With the above-mentioned deposition step, an insulating material is formed as a layer insulating film 134 on the surface of the semiconductor substrate in which memory cell capacitor elements are formed, and bit line 136 is formed through the insulating film 134. The bit line 136 is formed of a multi-layer conductor of polycrystalline Si wiring 136a and a metal having a high fusing point and is connected to the buried polycrystalline Si film 121a in a portion where the connection to the wiring formed in the semiconductor substrate is necessary. In the connection process, since the wiring formed in the substrate by diffusion has been drawn out on the substrate by the buried layer 121a, a sufficient contact area can be retained for an assured electrical connection.

Multi-layer wiring including four layers or over is employed in a high integrated LSI of 0.6 $\mu$m wiring width, such as a 16 MDRAM and the like, and the wiring to be connected to the substrate also includes two layers or over. In such a semiconductor configuration, also, the pattern of the polycrystalline Si film 121 is simultaneously formed in every portion where the contact hole making a contact between the multi-layer overlayer wiring and the substrate is to be formed, so that the polycrystalline Si buried layer is formed in every contact hole in self-alignment relative to the gate wiring. Moreover, since the capacitors 131, 132 and 133 can be formed by utilizing the projection 30, the capacitors 131, 132 and 133 can increase in the total area by the area surrounded by the projection 30 much more than the capacitor electrode 241 having no such projection as the projection 30 in this embodiment (see FIG. 15). Thus, the capacitors 131, 132 and 133 can have the total accumulated capacity larger than the accumulated capacity of the capacitor electrode 241 having no projection.

The semiconductor device shown in FIG. 4 has a configuration having underlayer wiring which is a diffused layer formed in the substrate, and overlayer wiring which consists a capacitor lower electrode of a memory cell and bit line.

As previously mentioned, according to the present invention, a contact hole which makes a contact between multi-layer underlayer and overlayer wirings in a high integrated LSI having a wiring width of 0.6 μm or under can be assuredly formed at high density. Moreover, since a capacitor can be formed by utilizing a projection, the capacitor can increase in accumulated capacity much more than a capacitor formed in a contact hole having no projection. The contact hole between the underlayer and overlayer wirings is formed in self-alignment relative to the wirings, so that the alignment of the patterns in a projection and exposure can be performed with little accuracy. Thus, good yields in manufacturing can be expected. The present invention is suitable especially for a semiconductor memory which requires multi-layer wiring.

We claim:

1. A method of manufacturing a semiconductor memory, comprising the steps of, on a semiconductor substrate having underlayer wiring which is composed of a plurality of gate portions provided with side walls and a diffused region between the gate regions,
   i) forming a layer insulating film which is smaller in thickness in the diffused region than the side walls of each of the gate regions and which is made of a material etched more easily than the material of the semiconductor substrate;
   ii) depositing a conductive layer of a material etched more easily than the layer insulating film, over the entire surface of the layer insulating film;
   iii) removing the conductive layer except a portion where a contact hole is to be formed in the diffused region, by etching with a pattern film for forming the contact hole;
   iv) depositing an insulating film and a pattern film for forming the contact hole over the entire surface again; and
   v) removing the insulating film, the remaining conductive layer and the layer insulating film by etching one after another to form the contact hole extending to the diffused region in self-alignment, and forming a toothed projection of the insulating film which remains after the etching at an upper opening of the contact hole by removing the pattern employed for forming the contact hole.

2. A method according to claim 1, wherein the semiconductor substrate is a Si substrate, the layer insulating film is a $SiO_2$ film, and the conductive layer is a polysilicon layer.

3. A method of manufacturing a semiconductor memory, comprising the steps of, on a semiconductor substrate having underlayer wiring which is composed of a plurality of gate portions provided with side walls and a diffused region between the gate regions,
   i) forming a layer insulating film which is smaller in thickness in the diffused region than the side walls of each of the gate regions and which is made of a material etched more easily than the material of the semiconductor substrate;
   ii) depositing a conductive layer of a material etched more easily than the layer insulating film, over the entire surface of the layer insulating film;
   iii) removing the conductive layer except a portion where a contact hole is to be formed in the diffused region, by etching with a pattern film for forming the contact hole;
   iv) depositing an insulating film and a pattern film for forming the contact hole over the entire surface again;
   v) removing the insulating film, the remaining conductive layer and the layer insulating film by etching one after another to form the contact hole extending to the diffused region in self-alignment, and forming a toothed projection of the insulating film which remains after the etching at an upper opening of the contact hole by removing the pattern employed for forming the contact hole;
   vi) depositing a polysilicon film doped with impurity at high concentration to fill and cover the contact hole having a projection and patterning the polysilicon film by projection and exposure, and reactive ion etching to form a capacitor lower electrode; and
   vii) further depositing a polysilicon film doped with the impurity at high concentration through a capacitor insulating film of a SiN film and patterning the polysilicon film by projection and exposure, and reactive ion etching to form a capacitor upper electrode.

4. A method according to claim 3, wherein the semiconductor substrate is a Si substrate, the layer insulating film is a $SiO_2$ film, and the conductive layer is a polysilicon layer.

5. A method of manufacturing a semiconductor memory, comprising the steps of, on a semiconductor substrate having underlayer wiring which is composed of a plurality of gate portions provided with side walls and a diffused region between the gate regions,
   i) forming a layer insulating film which is smaller in thickness in the diffused region than the side walls of each of the gate regions and which is made of a material etched more easily than the material of the semiconductor substrate;
   ii) etching the layer insulating film with a pattern film for forming a contact hole to form the contact hole extending to the diffused region in self-alignment, and forming a toothed projection of the layer insulating film which remains after the etching at an upper opening of the contact hole by removing the pattern employed for forming the contact hole;
   iii) depositing a conductive layer of a material etched more easily than the layer insulating film over the entire surface of the layer insulating film having the contact hole having a projection;
   iv) removing the conductive layer except the portion where the contact hole is to be formed in the diffused region, by etching with a pattern film for forming a contact hole so as to fill the contact hole with the remaining conductive layer which is to serve as a buried film; and
   v) depositing an insulating film over the entire surface and forming a through-hole for connecting bit line on the buried film in the insulating film to connect the bit line through the through-hole and the buried film to the diffused region.

6. A method of manufacturing a semiconductor memory, comprising the steps of, on a semiconductor substrate having underlayer wiring which is composed of a plurality of gate portions provided with side walls and a diffused region between the gate regions, i) forming a layer insulating film which is smaller in thickness in the diffused region than the side walls of each of the gate regions and which is made of a material etched more easily than the material of the semiconductor substrate;

ii) depositing a conductive layer of a material etched more easily than the layer insulating film, over the entire surface of the layer insulating film;

iii) removing the conductive layer except portions where contact holes for a capacitor electrode and bit line are to be formed in the diffused region, by etching with a pattern film for forming the contact hole;

iv) depositing an insulating film and then etching back the insulating film to leave the insulating film only on the wall close to the remaining conductive layer and forming a toothed projection of the remaining insulating film in position corresponding to an upper opening of a contact hole formed in the following step;

v) removing the remaining conductive layer by etching; and vi) etching back the layer insulating film to form a contact hole having the toothed projection at its upper opening in self-alignment.

7. A method according to claim 6, wherein the semiconductor substrate is a Si substrate, the layer insulating film is a $SiO_2$ film, and the conductive layer is a polysilicon layer.

8. A method of manufacturing a semiconductor memory, comprising the steps of, on a semiconductor substrate having underlayer wiring which is composed of a plurality of gate portions provided with side walls and a diffused region between the gate regions, i) forming a layer insulating film which is smaller in thickness in the diffused region than the side walls of each of the gate regions and which is made of a material etched more easily than the material of the semiconductor substrate;

ii) depositing a conductive layer of a material etched more easily than the layer insulating film, over the entire surface of the layer insulating film;

iii) removing the conductive layer except portions where contact holes for a capacitor electrode and bit line are to be formed in the diffused region, by etching with a pattern film for forming the contact hole;

iv) depositing an insulating film and then etching back the insulating film to leave the insulating film only on the wall close to the remaining conductive layer and forming a toothed projection of the remaining insulating film in position corresponding to an upper opening of a contact hole formed in the following step;

v) removing the remaining conductive layer by etching;

vi) etching back to layer insulating film to form a contact hole having the toothed projection at its upper opening in self-alignment; and vii) depositing a polysilicon film doped with impurity at high concentration to fill and cover the contact hole having projections and etching back it to form in advance a buried layer of polysilicon in the contact hole making a contact with overlayer wiring.

9. A method according to claim 8, wherein the semiconductor substrate is a Si substrate, the layer insulating film is a $SiO_2$ film, and the conductive layer is a polysilicon layer.

* * * * *